United States Patent
Delautre et al.

(10) Patent No.: US 12,392,256 B2
(45) Date of Patent: Aug. 19, 2025

(54) SUPERALLOY TURBOMACHINE PART WITH AN OPTIMIZED HAFNIUM CONTENT

(71) Applicants: SAFRAN AIRCRAFT ENGINES, Paris (FR); SAFRAN, Paris (FR); CENTRE NATIONAL DE LA RECHERCHE SCIENTIFIQUE, Paris (FR); UNIVERSITE DE LA ROCHELLE, La Rochelle (FR)

(72) Inventors: Joel Delautre, Moissy-Cramayel (FR); Christophe Philippe Audic, Moissy-Cramayel (FR); Sarah Hamadi, Moissy-Cramayel (FR); Virginie Jaquet, Moissy-Cramayel (FR); Fernando Pedraza Diaz, La Rochelle (FR); Annie Pasquet, Moissy-Cramayel (FR)

(73) Assignees: SAFRAN AIRCRAFT ENGINES, Paris (FR); SAFRAN, Paris (FR); CENTRE NATIONAL DE LA RECHERCHE SCIENTIFIQUE, Paris (FR); UNIVERSITE DE LA ROCHELLE, La Rochelle (FR)

( * ) Notice: Subject to any disclaimer, the term of this patent is extended or adjusted under 35 U.S.C. 154(b) by 509 days.

(21) Appl. No.: 17/797,920

(22) PCT Filed: Feb. 2, 2021

(86) PCT No.: PCT/FR2021/050187
§ 371 (c)(1),
(2) Date: Aug. 5, 2022

(87) PCT Pub. No.: WO2021/156564
PCT Pub. Date: Aug. 12, 2021

(65) Prior Publication Data
US 2023/0076728 A1 Mar. 9, 2023

(30) Foreign Application Priority Data

Feb. 6, 2020 (FR) .................................... 2001166

(51) Int. Cl.
*F01D 25/00* (2006.01)
*C22C 19/05* (2006.01)
(Continued)

(52) U.S. Cl.
CPC .......... *F01D 25/005* (2013.01); *C22C 19/057* (2013.01); *F01D 9/04* (2013.01);
(Continued)

(58) Field of Classification Search
CPC .......... F01D 25/005; F01D 9/04; F01D 5/288; F01D 5/28; C22C 19/057; F23R 3/002;
(Continued)

(56) References Cited

U.S. PATENT DOCUMENTS

| 4,639,280 A | 1/1987 | Fredholm et al. |
| 6,074,602 A * | 6/2000 | Wukusick ............. C22C 19/057 420/443 |

(Continued)

FOREIGN PATENT DOCUMENTS

| CN | 105312702 A | 2/2016 |
| EP | 1 652 964 A1 | 5/2006 |
| EP | 2 963 135 A1 | 1/2016 |

OTHER PUBLICATIONS

International Search Report as issued in International Patent Application No. PCT/FR2021/050187, dated Apr. 29, 2021.
(Continued)

*Primary Examiner* — Adil A. Siddiqui
(74) *Attorney, Agent, or Firm* — Pillsbury Winthrop Shaw Pittman LLP

(57) ABSTRACT

A turbomachine part includes a nickel-based superalloy substrate including, in mass content, 5.0% to 8.0% cobalt,
(Continued)

6.5% to 10% chromium, 0.5% to 2.5% molybdenum, 5.0% to 9.0% tungsten, 6.0% to 9.0% tantalum, 4.5% to 5.8% aluminum, hafnium in a mass content between 500 ppm and 1100 ppm, and optionally including niobium in a mass content less than or equal to 1.5%, and optionally at least one of carbon, zirconium and boron each in a mass content less than or equal to 100 ppm, the remainder being composed of nickel and unavoidable impurities.

9 Claims, 2 Drawing Sheets

(51) Int. Cl.
    *F01D 9/04*             (2006.01)
    *F23R 3/00*            (2006.01)

(52) U.S. Cl.
    CPC .......... *F23R 3/002* (2013.01); *F05D 2220/32* (2013.01); *F05D 2240/12* (2013.01); *F05D 2240/35* (2013.01); *F05D 2300/175* (2013.01)

(58) Field of Classification Search
    CPC ............. F05D 2220/32; F05D 2240/12; F05D 2240/35; F05D 2300/175; F05D 2230/90; F05D 2260/95; F05D 2300/135; F05D 2300/182; C23C 28/32; C23C 28/3455; C30B 29/52
    See application file for complete search history.

(56) References Cited

U.S. PATENT DOCUMENTS

2006/0093851 A1\*   5/2006   Darolia ................... C23C 30/00
                                                        416/241 R
2015/0377037 A1    12/2015   Salm et al.

OTHER PUBLICATIONS

First Office Action as issued in Chinese Patent Application No. 202180013356.7, dated Jan. 17, 2025.

\* cited by examiner

[Fig. 1]
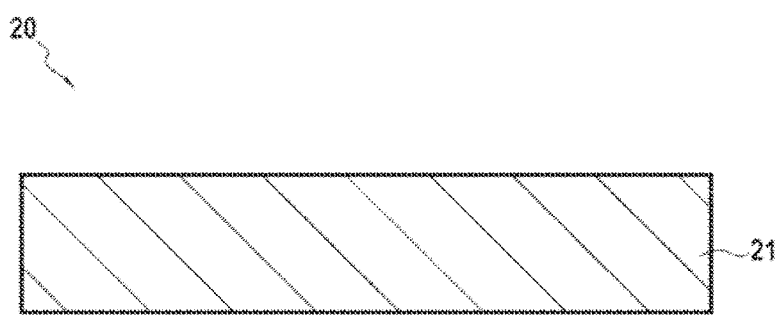
[Fig. 2]
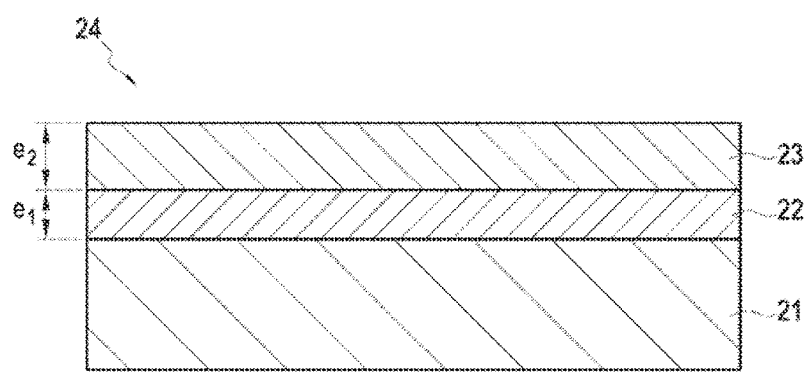

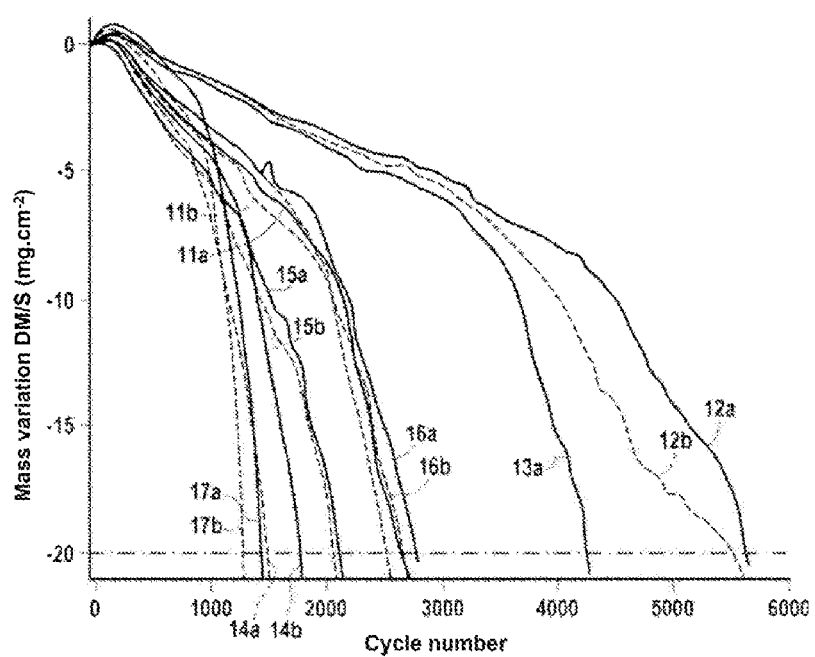
[Fig. 3]

SUPERALLOY TURBOMACHINE PART WITH AN OPTIMIZED HAFNIUM CONTENT

CROSS-REFERENCE TO RELATED APPLICATIONS

This application is the U.S. National Stage of PCT/FR2021/050187, filed Feb. 2, 2021, which in turn claims priority to French patent application number 2001166 filed Feb. 6, 2020. The content of these applications are incorporated herein by reference in their entireties.

TECHNICAL FIELD

The present invention relates to the field of nickel-based superalloys and more precisely to superalloys used in the aeronautical field.

PRIOR ART

It is known that nickel-based superalloys have, on the one hand, high mechanical strength even at high temperature and, on the other hand, good resistance to oxidation. Due to these two properties, they represent a material of choice for parts of turbomachines used in the aeronautical field.

Among the known nickel-based superalloys, mention may notably be made of the alloy with the trade name AM-1 corresponding to the composition described in the document U.S. Pat. No. 4,639,280.

It is desirable to optimize the oxidation resistance of these alloys.

DISCLOSURE OF THE INVENTION

In this regard, it is to the credit of the inventors to have succeeded in optimizing the composition of a turbomachine part in order to obtain improved oxidation resistance properties. For this, the inventors provide a turbomachine part comprising: a nickel-based superalloy comprising, in mass content, 5.0% to 8.0% cobalt, 6.5% to 10% chromium, 0.5% to 2.5% molybdenum, 5.0% to 9.0% tungsten, 6.0% to 9.0% tantalum, 4.5% to 5.8% aluminum, hafnium in a mass content between 500 ppm and 1100 ppm, and optionally comprising niobium in a mass content less than or equal to 1.5%, and optionally at least one of carbon, zirconium and boron each in a mass content less than or equal to 100 ppm, the remainder being composed of nickel and unavoidable impurities.

The invention provides a turbomachine part comprising an alloy with a composition close to AM-1 but with an optimized hafnium content, so as to have a better oxidation resistance.

The inventors have observed that such a part has a particularly high oxidation resistance. Without wishing to be bound by theory, the inventors consider that, when the hafnium content is too low, little oxidation of Hf occurs and the oxide $HfO_2$ does not fulfill the role of a structure anchoring the oxide layer on the superalloy surface. Similarly, if the hafnium content is too low, the hafnium does not sufficiently block the outward diffusion of cations, which prevents the formation of protective layers of oxides such as $\alpha\text{-}Al_2O_3$. For hafnium contents above 1100 ppm, excessively large hafnium oxides $HfO_2$ may form and the toughness of the oxide/metal interface may decrease, which is detrimental to the protective role of the oxide.

In an embodiment, the mass content of hafnium in the substrate may be between 670 ppm and 780 ppm.

The inventors have found that this hafnium content made it possible to provide a part having the best resistance to oxidation.

In addition, the inventors have found that a part having an optimized hafnium content has good mechanical properties, close to those of a part made of AM1, and can therefore be used in the same engine part applications as AM1. It is possible to shape a part of the invention by the shaping processes of the prior art, already applicable to parts made of AM1. In particular, the proposed optimized hafnium content does not affect the feasibility of the homogenization steps of the turbomachine parts which can be carried out at the end of the shaping of the parts made of AM1.

In one embodiment, the superalloy may define an outer surface of the part. In other words, it is not necessary to cover the part with a coating to benefit from the oxidation resistance properties conferred by the part described above.

In another embodiment, a β-structured nickel aluminide coating may be present on the surface of a superalloy as described above. Thus, in one embodiment, a turbomachine part may comprise:
 a substrate formed by the nickel based superalloy, and
 a β-structured nickel aluminide coating present on the substrate.

It will be noted that generally the β-structured nickel aluminide coating may or not be modified by one or more elements, for example platinum, zirconium or hafnium. Thus, as a β-structured nickel aluminide coating suitable for the invention, mention may in particular be made of β-structured NiAl, β-structured NiPtAl, β-structured NiAlZr and β-structured NiAlHf.

In one embodiment, the β-structured nickel aluminide coating is a β-structured NiAl coating or a β-structured NiPtAl coating.

The β-structured nickel aluminide coating can be formed by a method known per se. For instance, the β-structured nickel aluminide can be formed by physical vapor deposition, by chemical vapor deposition, by solid carburizing or via a slurry process.

In the previous embodiment, a turbomachine part according to the invention may further comprise a thermal barrier present on the β-structured nickel aluminide coating.

Such a thermal barrier is known per se, and makes it possible to protect the turbomachine part against the high temperatures which it encounters during its use.

In one embodiment, the thermal barrier may be present in contact with the β-structured nickel aluminide coating.

In one embodiment, the superalloy is monocrystalline. A monocrystalline superalloy allows a faster migration of the hafnium and in greater quantity towards the surface since the hafnium is not trapped by the carbon generally introduced to stabilize the grain boundaries of a polycrystalline alloy. This further improves the protection imparted by the hafnium and therefore the oxidation resistance of the part.

In one embodiment, the turbomachine part may be a turbomachine vane, a turbomachine distributor, a turbomachine turbine ring, or a turbomachine combustion chamber. The distributor can be a high or low pressure distributor.

In a preferred embodiment, the turbomachine part may be a turbomachine vane or a turbomachine high pressure distributor.

According to another of its aspects, the invention also relates to a turbomachine comprising a part as described above.

BRIEF DESCRIPTION OF THE FIGURES

FIG. 1 shows schematically and partially a sectional view of a turbomachine part according to one embodiment of the invention.

FIG. 2 shows schematically and partially a sectional view of a turbomachine part according to another embodiment of the invention.

FIG. 3 is a comparative test result showing the differences in terms of oxidation resistance between parts according to the invention and parts outside the invention.

DETAILED DESCRIPTION

The description will now be given by means of figures aimed at better understanding the invention but which should in no way be interpreted in a limiting manner.

FIG. 1 represents a first embodiment of the invention, wherein a turbomachine part 20 is made solely of a superalloy 21 without any coating being applied to it. In this embodiment, the superalloy forms the outer portion of the part.

FIG. 2, illustrating another particular embodiment of the invention, shows schematically a turbomachine part 24 composed of a superalloy substrate 21 and a β-structured nickel aluminide coating 22 which covers the underlying superalloy substrate 21.

In the embodiment shown, the turbomachine part 24 further comprises a thermal barrier 23 in contact with the β-structured nickel aluminide coating 22. The thermal barrier 23 can define the outer surface of the part 20.

In one embodiment, the coating 22 may have a thickness $e_1$ between 40 μm and 90 μm.

Likewise, the thermal barrier 23 may have a thickness $e_2$ between 50 μm and 300 μm.

In one embodiment, the thermal barrier can be chosen from a zirconia partially stabilized with yttria or one or more other rare earth oxide(s), a zirconia doped with dysprosium, gadolinium zirconate, a perovskite.

In an alternative embodiment, the thermal barrier 23 may be absent. In this case, the β-structured nickel aluminide coating 22 can define the outer surface of the part.

EXAMPLE

Several AM-1 samples were enriched with a hafnium mass content ranging from 340 ppm to 8000 ppm. Samples according to the invention are thus produced when the hafnium level is between 500 ppm and 1100 ppm, and others are produced outside the invention.

The samples vary only in their hafnium mass contents.

The hafnium content of the samples thus prepared is measured by mass spectrometry. Each sample is then subjected to oxidation cycles, and the mass change of each sample is measured three times a week for the first 200 cycles, then twice a week thereafter.

The samples tested in this example are not coated. In other words, the face of the sample that undergoes the oxidation cycles is made of superalloy.

An oxidation cycle corresponds to a very fast heating up to the oxidation temperature (1150° C.±5° C.), a holding at 1150° C. under atmospheric air pressure for 60 minutes and finally a forced cooling with dry air for 15 minutes to ensure that the room temperature is below 150° C.±3° C. The test is stopped when a specific mass loss of 20 $mg/cm^2$ is observed.

FIG. 3 illustrates the results obtained for each sample. The hafnium mass contents of the samples represented in FIG. 3 are 340 ppm for curves 11a and 11b, 670 ppm for curves 12a and 12b, 780 ppm for curve 13a, 1300 ppm for curves 16a and 16b, 2100 ppm for curves 15a and 15b, 4700 ppm for curves 14a and 14b and 8000 ppm for curves 17a and 17b.

There is no difference in the composition of the samples whose results are represented with a number followed by the letter a and the composition of the samples whose results are represented with the same number followed by the letter b.

It can be seen in FIG. 3 that the samples with a hafnium mass content between 500 ppm and 1100 ppm (12a, 12b, and 13a) are also those for which the mass loss is the least important. This optimized hafnium content therefore allows a better oxidation resistance.

The expression "between . . . and . . . " should be understood as including the limits.

The invention claimed is:

1. A turbomachine part comprising a nickel-based superalloy substrate comprising, in mass content, 5.0% to 8.0% cobalt, 6.5% to 10% chromium, 0.5% to 2.5% molybdenum, 5.0% to 9.0% tungsten, 6.0% to 9.0% tantalum, 4.5% to 5.8% aluminum, hafnium in a mass content between 500 ppm and 1100 ppm, and optionally comprising niobium in a mass content less than or equal to 1.5%, and optionally at least one of carbon, zirconium and boron each in a mass content less than or equal to 100 ppm, the remainder being nickel and unavoidable impurities.

2. The turbomachine part according to claim 1, wherein the hafnium mass content in the superalloy is between 670 ppm and 780 ppm.

3. The turbomachine part according to claim 1, wherein the superalloy defines an outer surface of the part.

4. The turbomachine part according to claim 1, comprising:
a substrate formed by the nickel based superalloy, and
a β-structured nickel aluminide coating present on the substrate.

5. The turbomachine part according to claim 4, wherein the β-structured nickel aluminide coating is a β-structured NiAl coating or β-structured NiPtAl coating.

6. The turbomachine part according to claim 4, wherein a thermal barrier is present on the β-structured nickel aluminide coating.

7. The turbomachine part according to claims 1, wherein the superalloy is monocrystalline.

8. The turbomachine part according to claims 1, wherein said part is a turbomachine vane, a turbomachine distributor, a turbomachine turbine ring, or a turbomachine combustion chamber.

9. A turbomachine comprising a part according to claims 1.

* * * * *